United States Patent
Brewer et al.

(10) Patent No.: US 12,542,389 B2
(45) Date of Patent: Feb. 3, 2026

(54) REVERSIBLE ATTACHMENT MICRO CONNECTOR

(71) Applicant: The Boeing Company, Arlington, VA (US)

(72) Inventors: Peter D. Brewer, Westlake Village, CA (US); Chia-Ming Chang, Agoura Hills, CA (US); Diego Eduardo Carrasco, Los Angeles, CA (US); Sevag Terterian, Lake Balboa, CA (US); Charbel Abijaoude, Newbury Park, CA (US)

(73) Assignee: THE BOEING COMPANY, Arlington, VA (US)

( * ) Notice: Subject to any disclaimer, the term of this patent is extended or adjusted under 35 U.S.C. 154(b) by 439 days.

(21) Appl. No.: 18/345,021

(22) Filed: Jun. 30, 2023

(65) Prior Publication Data

US 2025/0007195 A1    Jan. 2, 2025

(51) Int. Cl.
*H01R 13/05* (2006.01)
*H01R 13/193* (2006.01)
*H01R 13/24* (2006.01)

(52) U.S. Cl.
CPC ......... *H01R 13/052* (2013.01); *H01R 13/193* (2013.01); *H01R 13/2414* (2013.01)

(58) Field of Classification Search
CPC ............ H01R 13/052; H01R 13/2414; H01R 13/193; H01R 13/18; H05K 3/326
USPC ......................................... 439/816
See application file for complete search history.

(56) References Cited

U.S. PATENT DOCUMENTS

| | | | |
|---|---|---|---|
| 5,702,269 A | * | 12/1997 | Uchida .............. H01R 13/2414 439/496 |
| 5,962,921 A | * | 10/1999 | Farnworth ........... G01R 1/0408 257/773 |
| 6,261,130 B1 | | 7/2001 | Huynh et al. |
| 6,329,829 B1 | | 12/2001 | Farnworth et al. |
| 6,543,131 B1 | | 4/2003 | Beroz et al. |

(Continued)

OTHER PUBLICATIONS

Chow, E.M. et al., " Intermittency Study of A Stressed Metal Micro-Spring Sliding Electrical Contact", Electronic Components and Technology Conference, 2003, p. 1714- 1717, IEEE.

(Continued)

*Primary Examiner* — Christopher M Koehler
*Assistant Examiner* — Gregory L Mangot
(74) *Attorney, Agent, or Firm* — MH2 Technology Law Group LLP

(57) ABSTRACT

A reversible attachment micro connector includes a pin and mounted on a first assembly and a socket mounted on a second assembly. The socket is operational to mate with the pin at least two times to establish an electrical connection, and separate from the pin at least once. The socket includes a surround structure that defines a cavity with a floor. The cavity is sized to receive the pin. Multiple tabs are disposed in the cavity and coupled to the surround structure. The tabs have a negative longitudinal curvature that protrudes into the cavity. The tabs bend in three dimensions during insertion of the pin and removal of the pin. The negative longitudinal curvature generates a stress distribution that is uniform between the pin and the tabs while the pin is seated in the socket. The pin is retained in the socket based on the stress distribution.

20 Claims, 7 Drawing Sheets

(56) References Cited

U.S. PATENT DOCUMENTS

| | | | |
|---|---|---|---|
| 6,913,476 B2 | 7/2005 | Yean et al. | |
| 6,980,017 B1 * | 12/2005 | Farnworth | H05K 3/326 324/755.07 |
| 7,587,817 B2 * | 9/2009 | Williams | H05K 1/118 29/874 |
| 11,562,984 B1 | 1/2023 | Brewer et al. | |
| 2002/0016090 A1 * | 2/2002 | Haba | H01R 12/89 439/70 |

OTHER PUBLICATIONS

Haemer, J.M., "Flexible Micro-Spring Interconnects for High Performance Probing", Electronic Components and Technology Conference, p. 1157-1163, 2000 IEEE.

Han, H. et al., "Design and Modelling of a Micromechanical Surface Bonding System", p. 974-977, 1991, IEEE.

Chua, C.L. et al., "Densely Packed Optoelectronic Interconnect Using Micromachined Springs", IEEE Photonics Technology Letters, p. 846-848, vol. 14 No. 6, Jun. 2002, IEEE.

Kataoka, K. et al., "Contact Properties of Ni Micro-Springs for MEMS Probe Card", p. 231-235, vol. 8.4, 2004, IEEE.

Wagler, P.F., "Genreal-Purpose, Parallel and Reversible Microfluidic Interconnects", IEEE Transactions on Components, Packaging and Manufacturing Technology, Mar. 2015, p. 291-300, vol. 5 No. 3, IEEE Xplore.

Yaglioglu, O. et al., "Contact Testing of Copper Micro-Pillars with Very Low Damage for 3D IC Assembly", IEEE International Conference on 3D System Integration, 2013, IEEE.

Watanabe, N. et al., "Fine-Pitch Probing on TSVs and Microbumps Using a Chip Prober Having a Tranparent Membrane Probe Card", Electronic Components & Technology Conference, 2014, p. 2003-2007, IEEE.

Kim, B-H, et al., "A robust MEMS probe card with vertical guide for a fine pitch test", J. Micromech. Microeng., 2007, vol. 17, p. 1350-1359, IOP Publishing.

Pini, V. et al., How two-dimensional bending can extraordinarily stiffen thin sheets, 2016, p. 1-6, Scientific Reports.

Khumpuang, S. et al., "Novel Conductive Polymer Micro-Spring Contact Array for Large Area Woven Electronic Textile", MEMS, Jan. 23-27, 2011, IEEE Xplore.

Chow, E.M. et al., "Pressure Contact Micro-Springs in Small Pitch Flip-Chip Packages", IEEE Transactions on Components and Packaging Technologies, Dec. 2006, vol. 29 No. 4, IEEE.

Van Brachy, S. et al., "Compliant Continuouse-Locking Micro Mechanism", International Confrence on Manipulation, Automation and Robotics at Small Scales, Paris, France, 2016, pp. 1-7.

Khan, S. et al., "Reliability of Spring Interconnects for High Channel-Count Polymide Electrode Arrays", Journal of Miromech. Microeng., 2018, IOP Publishing Ltd.

Kataoka, K. et al., "Low Contact-Force and Compliant Mems Probe Card Utilizing Fritting Contact", 2002, IEEE.

Itoh, T. et al., "Development of an Electrostatically Acuated MEMS Switching Probe Card", p. 226-230, vol. 8.3, IEEE.

* cited by examiner

REVERSIBLE ATTACHMENT MICRO CONNECTOR

TECHNICAL FIELD

The disclosure relates generally to flip-chip connections, and in particular, to micro connectors.

BACKGROUND

Next-generation computing cores employ fine pitch, three-dimensional integration of multiple integrated circuits fabricated in different process technologies (i.e., deep sub-micron CMOS logic, dense memory, high performance electrical and/or optical input/output circuitry, power delivery, and novel computational processing layers, such as neuromorphic processing). Successful development of such systems involves techniques to test and identify known good die with fine-pitch pads, as well as techniques for reworking assemblies with the die. Existing rework techniques utilizing strain-based micro connectors exhibit nonuniform stress distributions that work against temporary connections.

Accordingly, those skilled in the art continue with research and development efforts in the field of micro connectors with uniform stress distributions that maintain a pin inserted in a socket without degrading the socket.

SUMMARY

A reversible attachment micro connector is provided herein. The reversible attachment micro connector includes a pin mounted on a first assembly and a socket mounted on a second assembly. The socket is operational to mate with the pin at least two times to establish an electrical connection. The socket is further operational to separate from the pin at least once. The socket includes a surround structure that defines a cavity with a floor. The cavity is sized to receive the pin. A plurality of tabs are disposed in the cavity and coupled to the surround structure. The plurality of tabs have a negative longitudinal curvature that protrudes into the cavity. The plurality of tabs bend in three dimensions during insertion of the pin and removal of the pin. The negative longitudinal curvature generates a stress distribution that is uniform between the pin and the plurality of tabs while the pin is seated in the socket. The pin is retained in the socket based on the stress distribution.

In one or more embodiments, the reversible attachment micro connector includes a plurality of contact layers coupled to the plurality of tabs, made of metal, and operational to engage the pin.

In one or more embodiments of the reversible attachment micro connector, the plurality of contact layers bend asymmetrically in a transverse direction through buckling instabilities during the insertion and the removal of the pin.

In one or more embodiments of the reversible attachment micro connector, the stress distribution is within an elastic regime of the metal that forms the plurality of contact layers.

In one or more embodiments of the reversible attachment micro connector, the plurality of contact layers is discontinuous around the cavity.

In one or more embodiments of the reversible attachment micro connector, the plurality of contact layers is perpendicular to the floor of the cavity.

In one or more embodiments of the reversible attachment micro connector, the surround structure and the plurality of tabs are formed of an elastomer.

In one or more embodiments of the reversible attachment micro connector, the elastomer provides a spring force that biases the plurality of contact layers against the pin.

In one or more embodiments, the reversible attachment micro connector includes a pad mounted on the floor of the socket, and operational to form a thermal compression bond with the pin.

In one or more embodiments of the reversible attachment micro connector, the pin has a tapered wall operational to engage the plurality of tabs.

In one or more embodiments of the reversible attachment micro connector, the pin has a cylindrical wall operational to engage the plurality of tabs.

In one or more embodiments of the reversible attachment micro connector, the first assembly includes a first array of pins. The second assembly includes a second array of sockets.

A method for reversible attachment connection is provided herein. The method includes inserting a pin into a socket a first time to establish an electrical connection that mates a first assembly with a second assembly. The pin is mounted on the first assembly. The socket is mounted on the second assembly. The socket includes a surround structure that defines a cavity with a floor. A plurality of tabs is disposed in the cavity and coupled to the surround structure. The plurality of tabs have a negative longitudinal curvature that protrudes into the cavity. The method includes bending the plurality of tabs in three dimensions during the inserting of the pin the first time, generating a stress distribution with the negative longitudinal curvature that is uniform between the pin and the plurality of tabs while the pin is seated in the socket, retaining the pin in the socket based on the stress distribution, removing the pin from the socket to separate the first assembly from the second assembly, bending the plurality of tabs in the three dimensions during the removing of the pin, and inserting the pin into the socket a second time to reestablish the electrical connection.

In one or more embodiments, the method further includes engaging the pin with a plurality of contact layers coupled to the plurality of tabs, wherein the plurality of contact layers are made of metal.

In one or more embodiments, the method further includes bending the plurality of contact layers asymmetrically in a transverse direction through buckling instabilities during the inserting of the pin the first time and the removing of the pin.

In one or more embodiments, the method further includes biasing a plurality of contact layers against the pin with a spring force provided by an elastomer that forms the plurality of tabs, wherein the plurality of contact layers are coupled to the plurality of tabs, made of metal, and operational to engage the pin.

In one or more embodiments, the method further includes forming a thermal compression bond between a pad mounted on the floor of the socket and the pin.

A reversible attachment micro connector is provided herein. The reversible attachment micro connector includes a first array of pins mounted on a first assembly and a second array of sockets mounted on a second assembly. The second array of sockets is operational to mate with the first array of pins at least two times to establish an electrical connection. The second array of sockets is further operational to separate from the first array of pins at least once. Individual sockets in the second array of sockets include a surround structure that defines a cavity with a floor. The cavity is sized to receive an individual pin of the first array of pins. A plurality of tabs are disposed in the cavity and coupled to the surround structure. The plurality of tabs have a negative longitudinal curvature that protrudes into the cavity. The plurality of tabs bend in three dimensions during insertion of the individual pin and removal of the individual pin. The negative longitudinal curvature generates a stress distribution that is uniform between the individual pin and the plurality of tabs while the individual pin is seated in the socket. The individual pin is retained in the individual socket based on the stress distribution.

In one or more embodiments of the reversible attachment micro connector, a pitch of the second array of sockets is at most approximately 10 micrometers.

In one or more embodiments of the reversible attachment micro connector, a misalignment between the first assembly and the second assembly while mated is at most approximately 0.1 micrometers.

The above features and advantages, and other features and advantages of the present disclosure are readily apparent from the following detailed description of the best modes for carrying out the disclosure when taken in connection with the accompanying drawings.

DETAILED DESCRIPTION

Embodiments of the present disclosure include an apparatus and/or a method that provides reversible attachment micro connectors. The reversible attachment capability generally allows probing and/or temporary assembly of multidimensional, fine pitch microelectronic assemblies through multiple reversible connect/disconnect cycles (e.g., at least two times) without external clamps. In various embodiments, the fine pitch among the micro connectors may be less than several microns (e.g., ≤10 μm). Each micro connector is configured as a pin and a socket (or receptacle). Mating surfaces of the socket have protruding tabs with negative longitudinal curvature. A function of an array of the micro connectors is to temporarily attach two-and-a-half dimensional and three-dimensional stack microelectronic assemblies for testing and screening. The micro connector arrays may also provide permanent integration of the assemblies using thermocompression bonding.

Each socket of the micro connector provides a clamping mechanism to a corresponding pin. The clamping mechanism utilizes a three-dimensional bending of protruding tab sidewalls during interaction (e.g., insertion and seating) with the pin that controls mechanical properties of the socket. In particular, a stiffness of the negatively curved protruding tab contact layers (e.g., in a longitudinal, depth direction) is a design parameter that tailors stress distributions between the mating pins (e.g., tapered and straight walled) and the socket. Elastic strain energy generated during the mating process is resolved by the transverse bending (through buckling instabilities) of the sidewalls rather than through strain, as is done in conventional designs. The bucking behavior may be controlled by employing different sidewall constraints. Engineering the mechanical properties of the sockets through various constraints (e.g., fixed vs. free edges), dimensions of the metal contacting surfaces, and elastomer surrounds offer possibilities of designs with uniform stress distributions for mating with either tapered pins or straight-walled pins. Eliminating the stress concentrations during mating and seating is beneficial for the reversibility function, and for retaining tapered pins in an initially straight-wall receptacle. The mechanics of this receptacle is unlike alternative fine-pitch collar designs that primarily resolve elastic energy through in-plane strains resulting in high stress concentrations at the top of the receptacle well leading to forces that tend to expel the pin or cold weld parts together.

Figure 1:
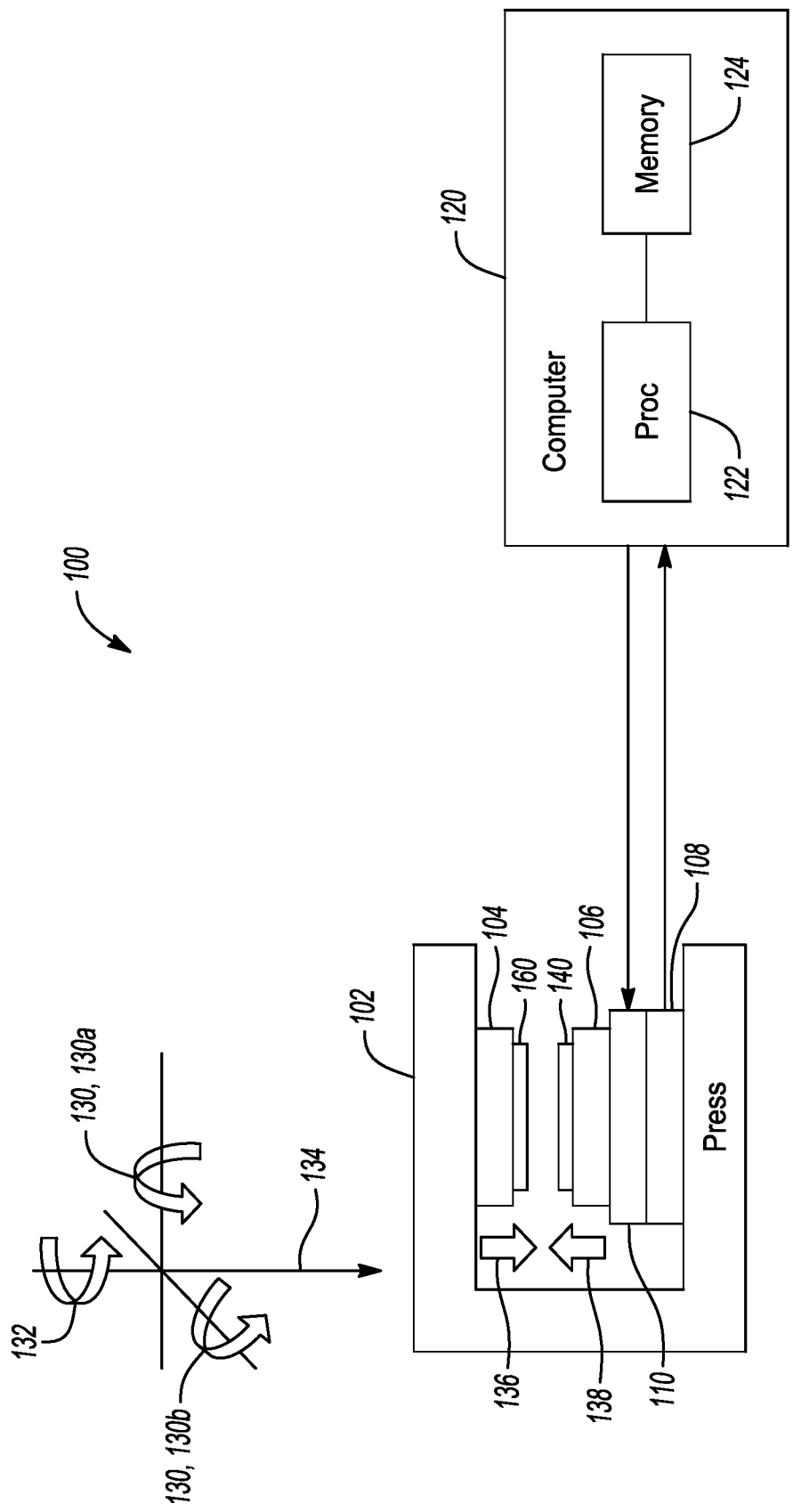
FIG. 1 is a schematic diagram of a compression system in accordance with one or more exemplary embodiments.

Referring to FIG. 1, a schematic diagram of an example implementation of a compression system 100 is shown in accordance with one or more exemplary embodiments. The compression system 100 generally includes a press 102 and a computer 120. The press 102 includes a top chuck 104, a bottom chuck 106, a load cell 108, and a heater 110. The computer 120 includes one or more processors 122 (one shown) and one or more memory devices 124 (one shown).

The press 102 implements a precision die bonder. In various embodiments, the press 102 implements an assembly-to-assembly alignment and thermocompression press. The press 102 is operational to align and press two assemblies together to form inter-assembly connections. The alignment may be provided by movement of the top chuck 104 relative to the bottom chuck 106 in multiple dimensions. By way of example, the top chuck 104 may tilt 130 relative to the bottom chuck 106. The tilt 130 may include movement in a pitch direction 130a and a roll direction 130b. In some embodiments, the bottom chuck 106 may be rotatable relative to the top chuck 104 in a yaw direction 132. In other embodiments, the top chuck 104 may be rotatable relative to the bottom chuck 106 in the yaw direction 132. The top chuck 104 is also moveable relative to the bottom chuck 106 in a vertical direction 134.

Movement of the top chuck 104 downward along the vertical direction 134 presses a first assembly 140 being held by the bottom chuck 106 against a second assembly 160 being held by the top chuck 104 with an applied pressure 136 (or force). The applied pressure 136 engages pin-and-socket micro connectors. The pressure 136 may be reversed to disengage the micro connectors. In some embodiments, the first assembly 140 may be held by the top chuck 104 and the second assembly 160 may be held by the bottom chuck 106. The load cell 108 measures the applied pressure 136 being applied between the first assembly 140 and the second assembly 160.

The top chuck 104 and the bottom chuck 106 each implement a vacuum chuck. The top chuck 104 and the bottom chuck 106 are operational to hold the second assembly 160 and the first assembly 140 during alignment, mating, disconnecting, and bonding.

The load cell 108 implements a pressure sensor. The load cell 108 is operational to detect the applied pressure 136 applied by the second assembly 160 onto the first assembly 140 during a calibration test of the press 102.

The heater 110 implements a variable heat source controlled by the computer 120. The heater 110 is operational to heat the first assembly 140 and the second assembly 160 to one or more temperatures determined by the computer 120. During a thermocompression bonding process, the heater 110 raises the temperature of the first assembly 140 and the second assembly 160 to a bonding temperature appropriate for bonding the materials used in inter-assembly bump bonds.

The computer 120 is coupled to the heater 110 and the load cell 108. The computer 120 implements one or more data processing computers. In embodiments with multiple computers 120, the individual computers 120 are coupled together to share data, memory space, and processing resources. The computer 120 may be operational to store the configuration data of the press 102 and execute software used to control the heater 110 and analyze the information received from the load cell 108.

The processor 122 implements one or more processors within the computer 120. The processor 122 is in communication with the memory device 124 to exchange commands and data. The processor 122 is operational to execute the software tools used to analyze the data generated by the load cell 108.

The memory device 124 implements one or more non-transitory computer readable storage devices (e.g., random access memory, read-only memory, magnetic hard drives, solid-state drives, etc.). The memory device 124 stores software programs (or tools) that are executed by the processor 122.

The thermocompression bonding process applied to the inter-assembly bond structures may be similar to conventional bump bond structure bonding processes. For example, thermocompression bonding may be performed at approximately 200 degrees Celsius (° C.) for gold and approximately 300° C. for copper and aluminum while under pressure (e.g., >40 megapascals (MPa) of bond metal area).

The first assembly 140 and the second assembly 160 implement substrates. In various embodiments, the substrates may be semiconductor substrates. The semiconductors generally includes silicon, germanium, gallium arsenide, aluminum gallium arsenide, silicon carbide, gallium nitride, indium phosphide and the like. The substrates may be in the form of a semiconductor die, a semiconductor tile, or a semiconductor wafer. The substrates may be formed of other materials to meet the design criteria of a particular application.

Figure 2:
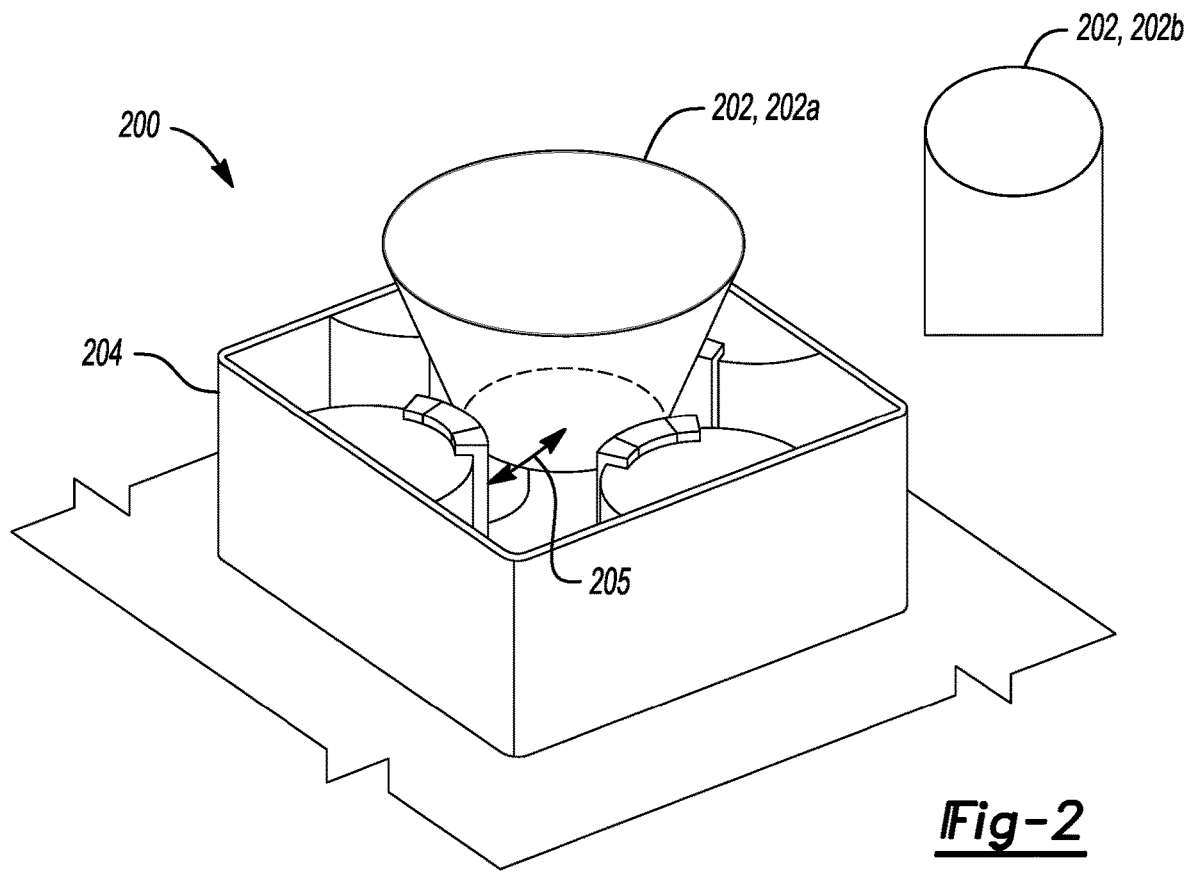
FIG. 2 is a schematic perspective diagram of a reversible attachment micro connector in accordance with one or more exemplary embodiments.

Referring to FIG. 2, a schematic perspective diagram of an example design of a reversible attachment micro connector 200 is shown in accordance with one or more exemplary embodiments. The reversible attachment micro connector 200 is dimensionally scalable for reversible fine-pitch attachment applications. The reversible attachment micro connector 200 generally includes a pin 202 and a socket 204. While mated, the pin 202 and the socket 204 form an electrical connection 205.

The pins 202 implements a thermocompression pin. A height of the pin 202 may range from approximately 3 µm to approximately 5 µm. A diameter of the pin 202 may range from approximately 2 µm to approximately 3 µm. The pin 202 illustrated over the socket 204 is an example as a tapered pin 202a. Another pin 202 illustrated to a side of the socket 204 is an example of a straight pin 202b.

Theoretical and experimental work that treats the stiffening of thin sheets of paper, subjected to two-dimensional bending, provides a mathematical framework for understanding the clamping mechanism employed in the socket 204 with thin metal contact layers. See for example, "How two-dimensional bending can extraordinarily stiffen thin sheets", V. Pini et al., Scientific Reports, 6, 29627, 2016, which is hereby incorporated by reference in its entirety. Equations for various constraint states are provided therein and provide guidance for tailoring the construction of a socket 204 using the complex bending mechanisms to generate uniform stress distributions for a tapered and straight-walled pin profiles. Subsequently, several general tenants may be stated that provide the working principles for the mechanics of the thin wall socket 204. The tenants generally include:

1. The stiffness of the unconstrained socket sidewall surface (e.g., contact layers) increases with the longitudinal curvature. The stiffness of the sidewalls, controlled by shape and dimensions in a free unconstrained state, governs the insertion and retention forces for mating with the pin 202.

2. Bending asymmetry: the inward and outward bending stiffness of the sidewalls of the tabs are different due to the longitudinal curvature. The stiffness of the negative curvature sidewalls is smaller in the outward direction compared to the inward direction.

3. In-plane stresses are developed when the sidewalls are subject to biaxial bending. The biaxial bending is a result of the high energy cost of in-plane straining $\sim(h/L)$ in comparison to the bending energy $\sim(h/L)^3$, where h is the thickness and L is the length of the sidewalls. A manifestation of the effect is that small in-plane stresses in the sidewalls give rise to formation of three-dimensional configurations (e.g., buckling instabilities).

4. Three-dimensional configurations developed due to inserting a pin 202 into a cavity of the socket 204 gives rise to internal strain configurations within the sidewalls. The curvature induced in-plane strain increases the elastic energy of the contact layer, leading to large stiffening. A resulting biaxial bending transition point is pushed lower in the socket 204 (e.g., closer to a constrained edge) leading to uniform stress distributions for a tapered pin 202a insertion.

Based on such principles and experimentation (e.g., from bending paper and other thin sheets), the negative transverse curvature of the protruding tabs of a socket 204 generate uniform stress distributions for a given mating pin profile (e.g., tapered pin 202a or straight pin 202b) by modifying how the sidewalls that forms the tabs are constrained and the design (e.g., width and thickness) of the contact layers. For example, if a bottom edge of the tabs are fixed, a varying stiffness is generated for longitudinally bending the sidewalls that increases from the top to the bottom of the socket 204 due to the constraint. The varying stiffness produces a near uniform stress distributions (e.g., pressure) during the mating with a tapered pin 202a. Other design parameters that affect the mechanical properties of the receptacle include, but are not limited to, a width (e.g., uniform or variable) of the contact layers (e.g., slender contact layers only have one degree of bending) and the thickness of the contact layers.

Figure 3:
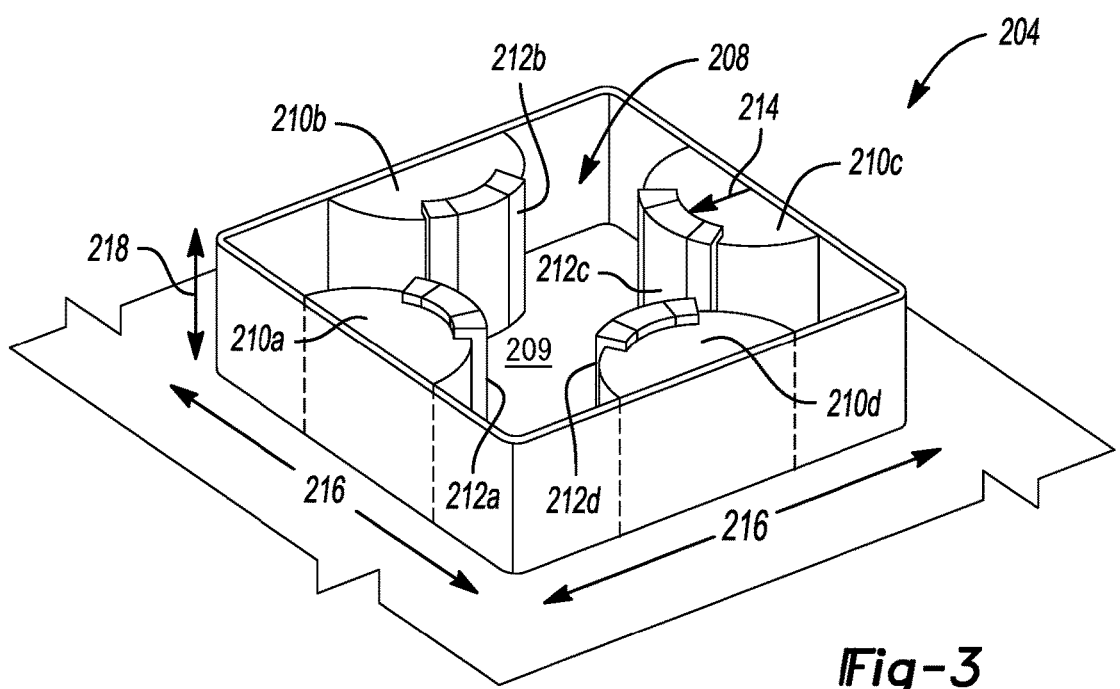
FIG. 3 is a schematic perspective diagram of a socket in accordance with one or more exemplary embodiments.

Referring to FIG. 3, a schematic perspective diagram of an example design of a socket 204 is shown in accordance with one or more exemplary embodiments. The socket 204 includes a surround structure 206 that defines a cavity 208 with a floor 209. Multiple tabs 210a-210d (four shown) with contact layers 212a-212d protrude into the cavity 208.

The surround structure 206 may be a polyimide layer that surrounds (either a continuous field or separated islands) a respective cavity 208 to provide restoring and clamping force for the contact layers 212a-212d. In various embodiments, the surround structure 206 may be an elastomer. Other materials may be used for the surround structure 206 to meet the design criteria of a particular application.

The cavity 208 is sized to receive the pin 202. The cavity 208 is arranged in a basically square pattern with dimensions of 216 micrometers per side. In various embodiments, the dimension 216 is 10 μm or less (e.g., 6 μm). In various embodiments, a depth 218 of the cavity 208 may be approximately 1.5 μm to 3 μm (e.g., 2 μm).

The tabs 210a-210d extend inward into the cavity 208. Each tab 210a-210d has a negative longitudinal curvature 214 (or radius). The negative longitudinal curvature 214 may be in a range of approximately 1 μm to 2 μm (e.g., 1.5 μm). While four tabs 210a-210d are illustrated, other numbers of tabs (e.g., two, three, five, etc.) may be implemented to meet the design criteria of a particular application.

The contact layers 212a-212d may be perpendicular to the floor 209 of the cavity 208. The contact layers 212a-212d are narrow, constrained at a bottom edge, and discontinuous (or unconnected from each other) at a top edge. The contact layers 212a-212d are backed by the surround structure 206 that provides mechanical support and extra spring force for the contact layers 212a-212d. The contact layers 212a-212d may be metal (e.g., gold) contact layers for low resistance connection. Fabrication of the contact layers 212a-212d generally involves sputtering thin (approximately 25 nanometer (nm) to approximately 150 nm) metal sleeves.

Figure 4:
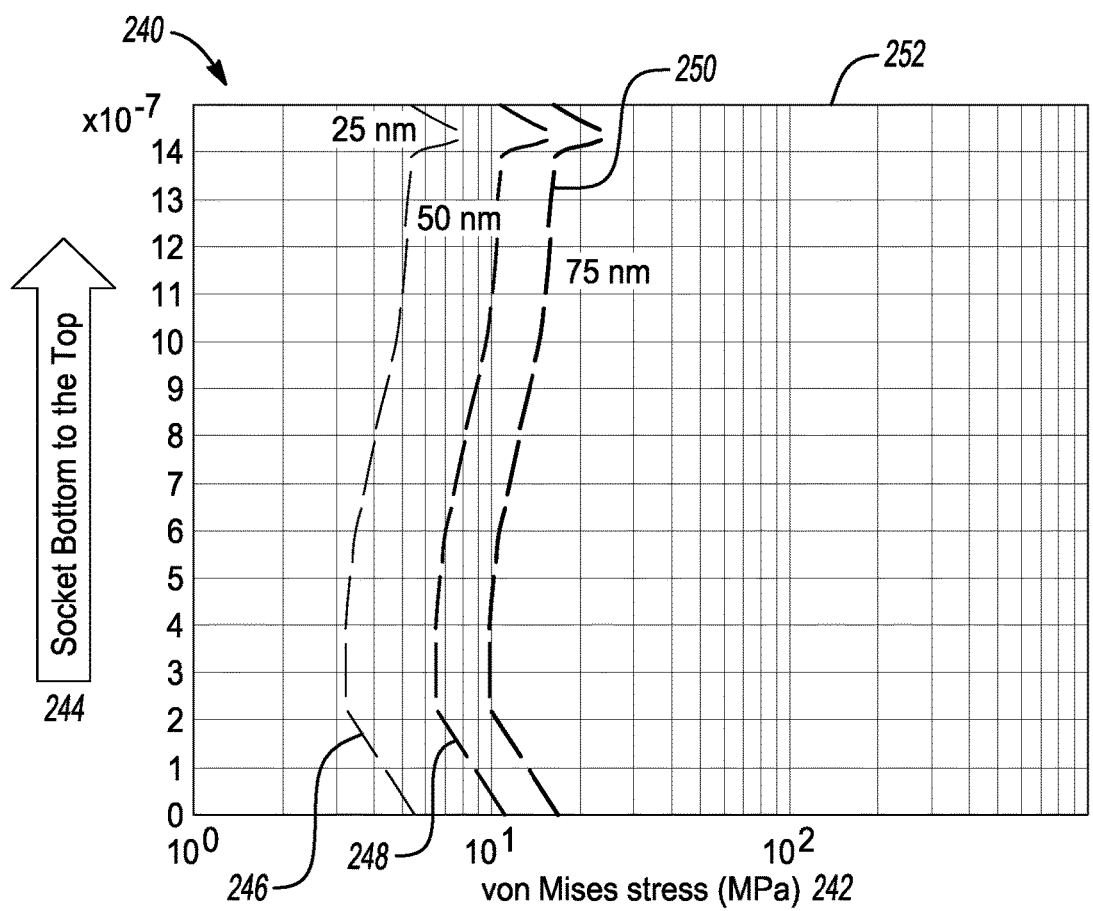
FIG. 4 is a graph of a stress distribution for the socket in accordance with one or more exemplary embodiments.

Referring to FIG. 4, a graph 240 of an example stress distribution for the socket 204 is shown in accordance with one or more exemplary embodiments. The graph 240 includes an X-axis 242 and a Y-axis 244. The X-axis 242 illustrates a von Mises stress in units of megaPascals (MPa). The Y-axis 244 illustrate the depth 218 of the socket 204 from bottom to top in units of tenths of a micrometer.

Stress distributions for the design were calculated using finite element analysis (FEA) for a tapered pin 202a with a sidewall angle (e.g., 78°) and a socket 204. The cavity 208 had an area dimension (ref. nos. 216 by 216) of 6 μm×6 μm, and a depth 218 of 2 μm. The overall stress levels from the top to the bottom of the receptacle are uniform and lie within the elastic regime 252 for gold contacting surfaces of the contact layers 212a-212d. The analysis also shows that the average stress level depends on a thickness of contact layers 212a-212d. Curves 246, 248, and 250 illustrate the stresses for 25 nanometer (nm), 50 nm, and 75 nm thick contact layers 212a-212d, respectively.

Figure 5:
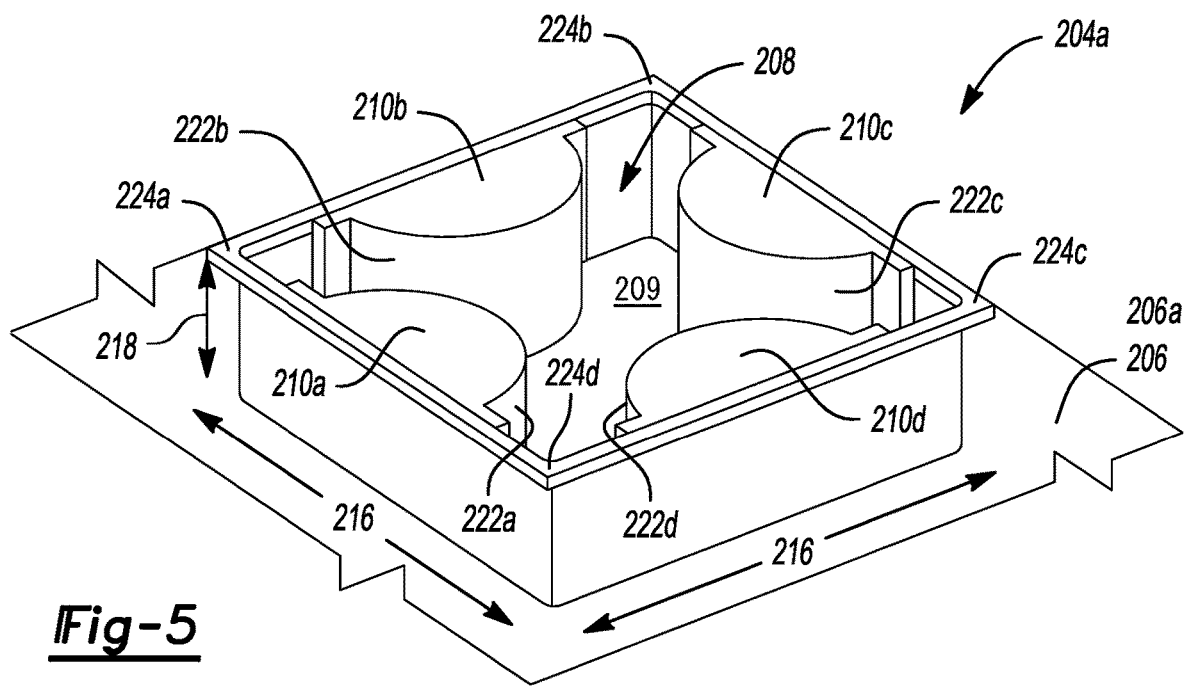
FIG. 5 is a schematic perspective diagram of another socket in accordance with one or more exemplary embodiments.

Referring to FIG. 5, a schematic perspective diagram of an example design of another socket 204a is shown in accordance with one or more exemplary embodiments. The socket 204a may be a variation of the socket 204. The socket 204a includes the surround structure 206 that defines the cavity 208. Multiple tabs 210a-210d (four shown) with contact layers 222a-222d extend into the cavity 208.

The contact layers 222a-222d may be perpendicular to the floor 209 of the cavity 208. The contact layers 222a-222d may be narrow, constrained the bottom edge, connected to each other at the top edge by braces 224a-224d, and constrained at the sides. The contact layers 222a-222d are backed by the surround structure 206 that provides mechanical support and extra spring force for the contact layers 222a-222d. The contact layers 222a-222d may be metal (e.g., gold) contact layers for low resistance connection.

Figure 6:
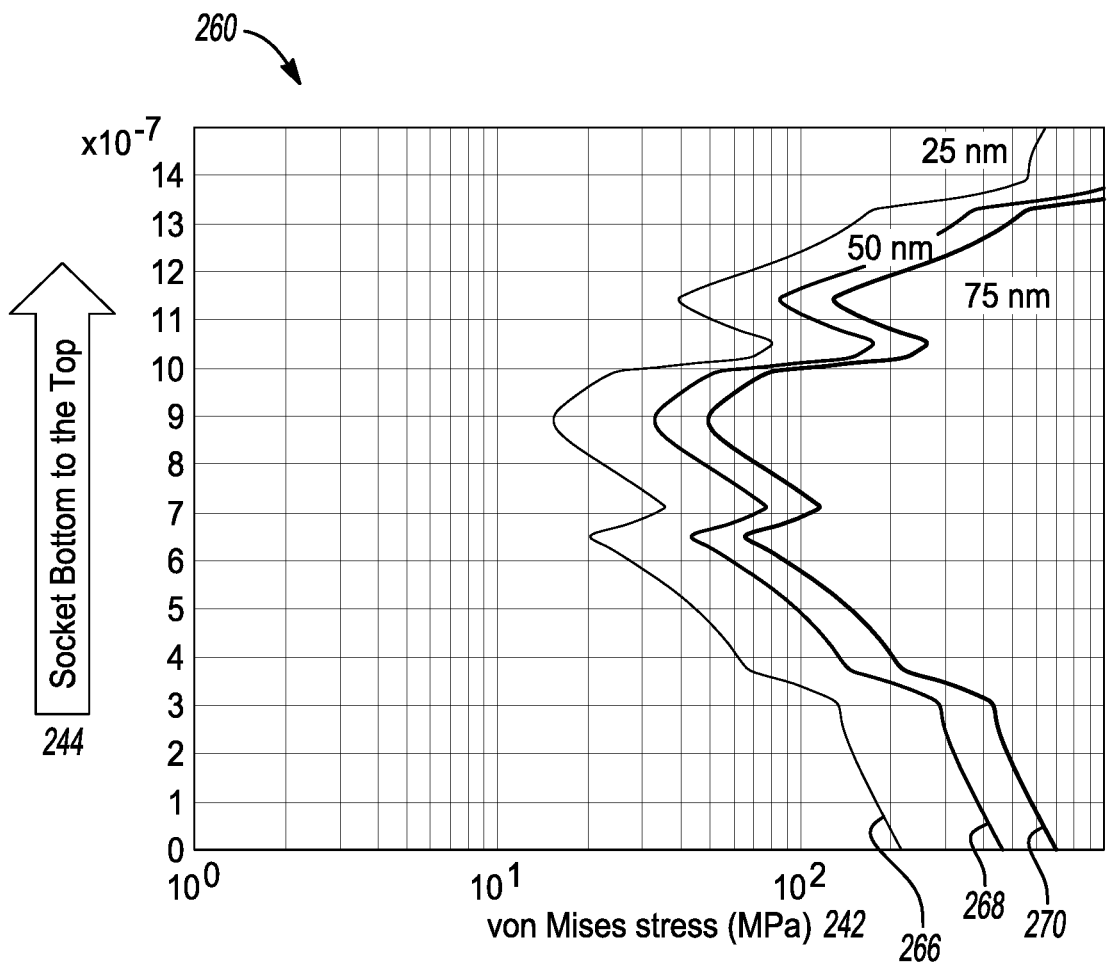
FIG. 6 is a graph of a stress distribution for the other socket in accordance with one or more exemplary embodiments.

Referring to FIG. 6, a graph 260 of an example stress distribution for the socket 204a is shown in accordance with one or more exemplary embodiments. The graph 260 includes the X-axis 242 and the Y-axis 244. The X-axis 242 illustrates a von Mises stress in units MPa. The Y-axis 244 illustrate the depth 218 of the socket 204a from bottom to top in units of tenths of a micrometer.

Stress distributions for the design were calculated using finite element analysis (FEA) for a tapered pin 202a with a sidewall angle (e.g., 78°) and a socket 204a. The cavity 208 had an area dimension (ref. nos. 216 by 216) of 6 μm×6 μm, and a depth 218 of 2 μm. Curves 266, 268, and 270 illustrate the stresses for 25 nm, 50 nm, and 75 nm thick contact layers 222a-222d, respectively. Constraining the contact layers 222a-222d increases the average stress levels and results in less uniform stress distributions along the longitudinal direction.

Figure 7:
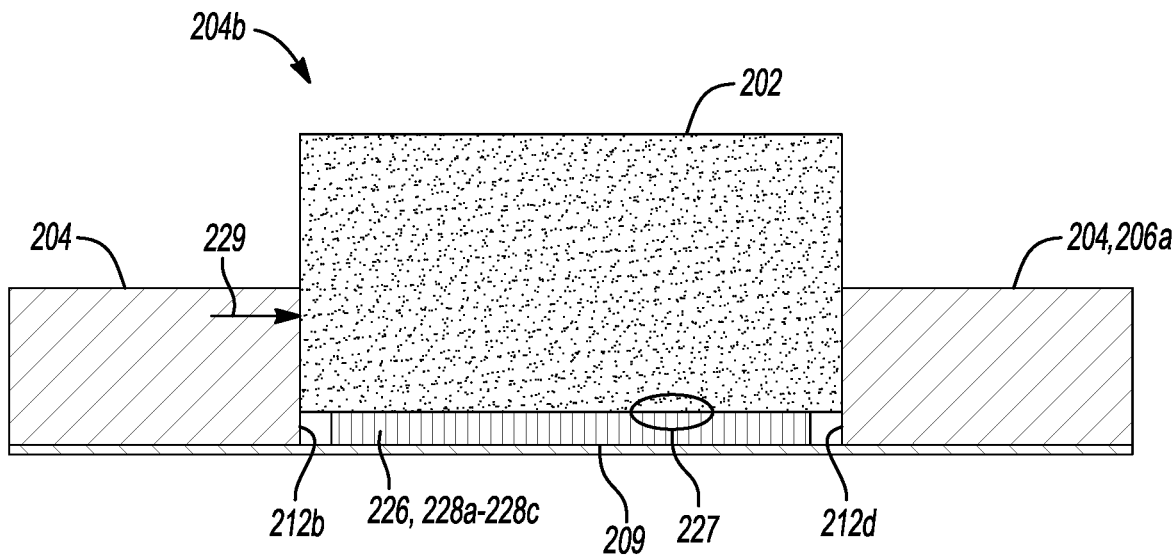
FIG. 7 is a schematic cross-section diagram of yet another socket in accordance with one or more exemplary embodiments.

Referring to FIG. 7, a schematic cross-section diagram of an example implementation of a socket 204b is shown in accordance with one or more exemplary embodiments. The socket 204b may be a variation of the socket 204 and/or the socket 204. The socket 204b may include a pad 226 disposed on the floor 209. In various embodiments, the pad 226 may be formed of a thermocompression bonding metal. For example, the pad 226 may be formed of gold 228a, copper 228b, or aluminum 228c. Other metal layers may be implemented to meet the design criteria of a particular application. The socket 204b may have a depth that enables a pin 202 to contact the pad 226. After a final insertion of a pin 202 into the socket 204b, the compression system 100 may be used to form a thermal compression bond 227 between the pin 202 to the pad 226. Compression of the elastomer 206a of the surround structure 206 generates a spring force 229 that biases the contact layers 212a-212d (212b and 212d shown) against the pin 202.

Figure 8:
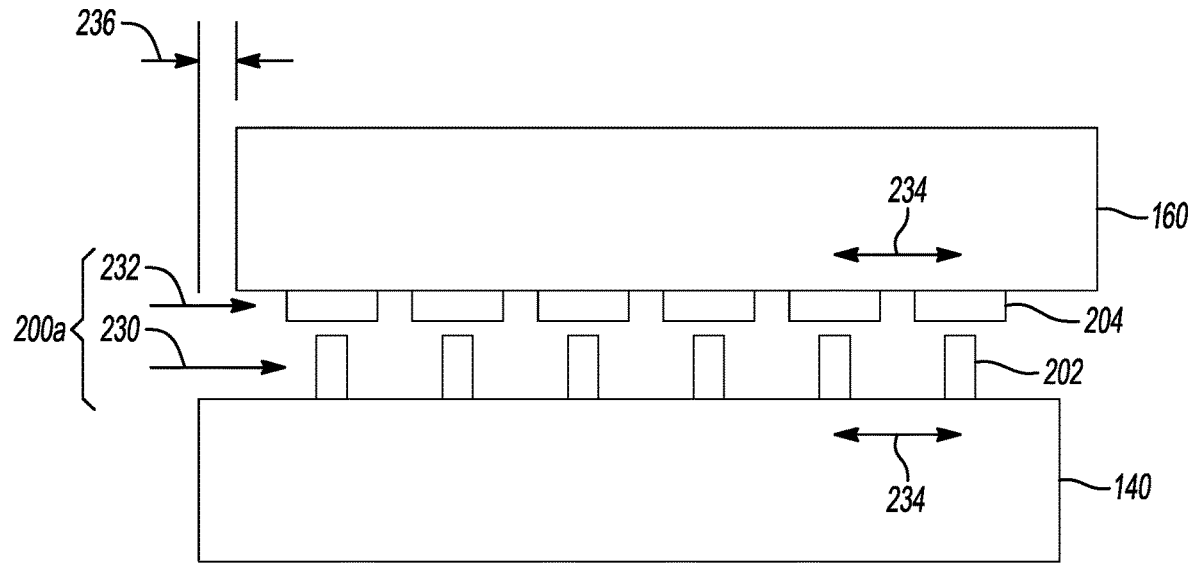
FIG. 8 is a schematic cross-section diagram of a first assembly and a second assembly in accordance with one or more exemplary embodiments.

Referring to FIG. 8, a schematic cross-section diagram of an example implementation of a reversible attachment micro connector array 200a is shown in accordance with one or more exemplary embodiments. The reversible attachment micro connector array 200a includes a first array of pins 230 on the first assembly 140 and a second array of sockets 232 on the second assembly 160. The first array of pins 230 is generally mirrored by the second array of sockets 232 such that each pin 202 corresponds to a respective socket 204. In various embodiments, the arrays may be one-dimensional arrays or two-dimensional arrays. A pitch 234 of the pins 202 and the socket 204 may be less than approximately 10 μm. A misalignment 236 between the first assembly 140 and the second assembly 160 while mated is at most 0.1 micrometers.

Figure 9:
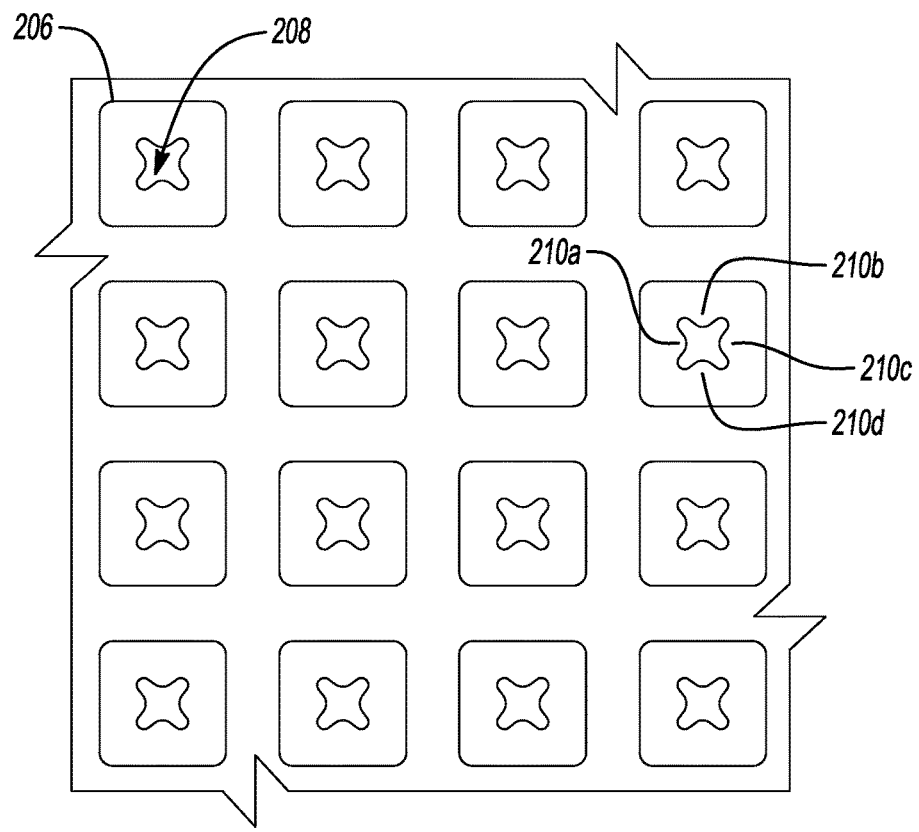
FIG. 9 is a plan diagram of an array of surround structures in accordance with one or more exemplary embodiments.

Referring to FIG. 9, a plan diagram of an example implementation of an array of surround structures 206 is shown in accordance with one or more exemplary embodiments. Each surround structure 206 generally defines the cavity 208 and the tabs 210a-210d. In some embodiments, each surround structure 206 defines an individual socket 204 (illustrated). In other embodiments, the surround structures 206 are a continuous sheet of material with the individual sockets 204 being defined by the cavities 208. The socket layouts include an underlying daisy-chain fan-out for testing connection yields. Testing with arrays of tapered pins 202*a* and the illustrated socket layouts and have shown the self-locating alignment and low resistance connections (e.g., approximately 0.4 ohm per link).

Figure 10:
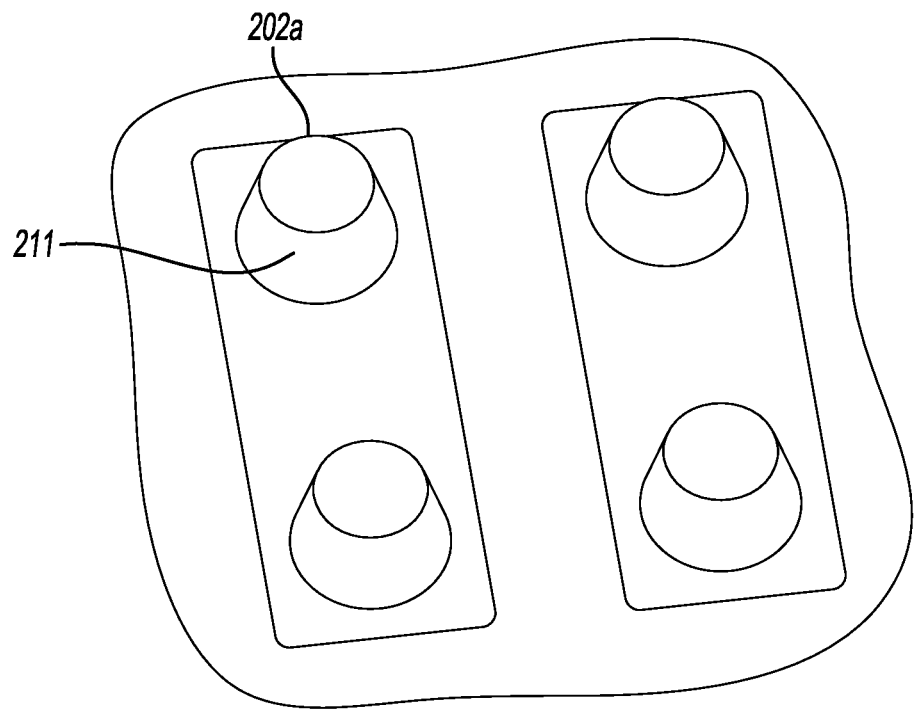
FIG. 10 is a perspective schematic of a tapered pin in accordance with one or more exemplary embodiments.

Referring to FIG. 10, a perspective schematic of an example implantation of a tapered pin 202*a* is shown in accordance with one or more exemplary embodiments. The pins 202 may be formed as tapered pins 202*a* (illustrated), as straight pins 202*b*, and as straight walled pins and tapered tops. For example, the tapered pins 202*a* may have a tapered wall 211. The designs for fine pitch designs generally keep the overall length of the pin 202 within a 3 µm to 5 µm range. A small taper angle for metallic spikes is approximately 65°. At such an angle, a 1.5 µm base spike with a 2 µm height is possible.

Figure 11:
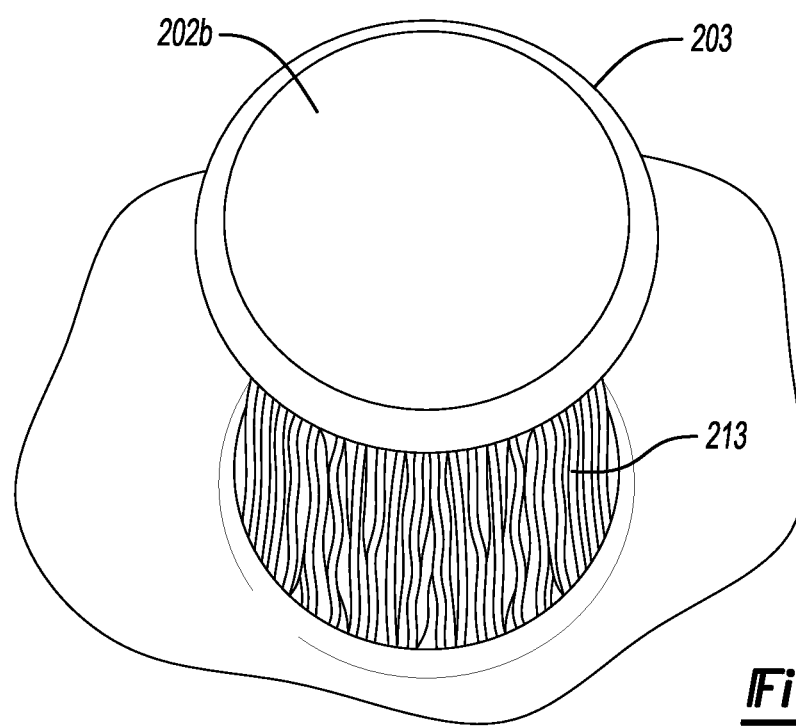
FIG. 11 is a perspective diagram of a polyimide pillar in accordance with one or more exemplary embodiments.

Referring to FIG. 11, a perspective diagram of an example implementation of a polyimide pillars that will become a core of a straight pin 202*b* is shown in accordance with one or more exemplary embodiments. A fabrication process for the straight pins 202*b* uses a polyimide as a core 203 and a tapered alignment tip on top. The core 203 generally forms a cylindrical wall 213. The tapered tip is useful for self-location of the pins 202 in the sockets 204. Self-alignment of the pins 202 in the socket 204 may result in a final alignment accuracy of less than approximately 0.1 µm.

Figure 12:
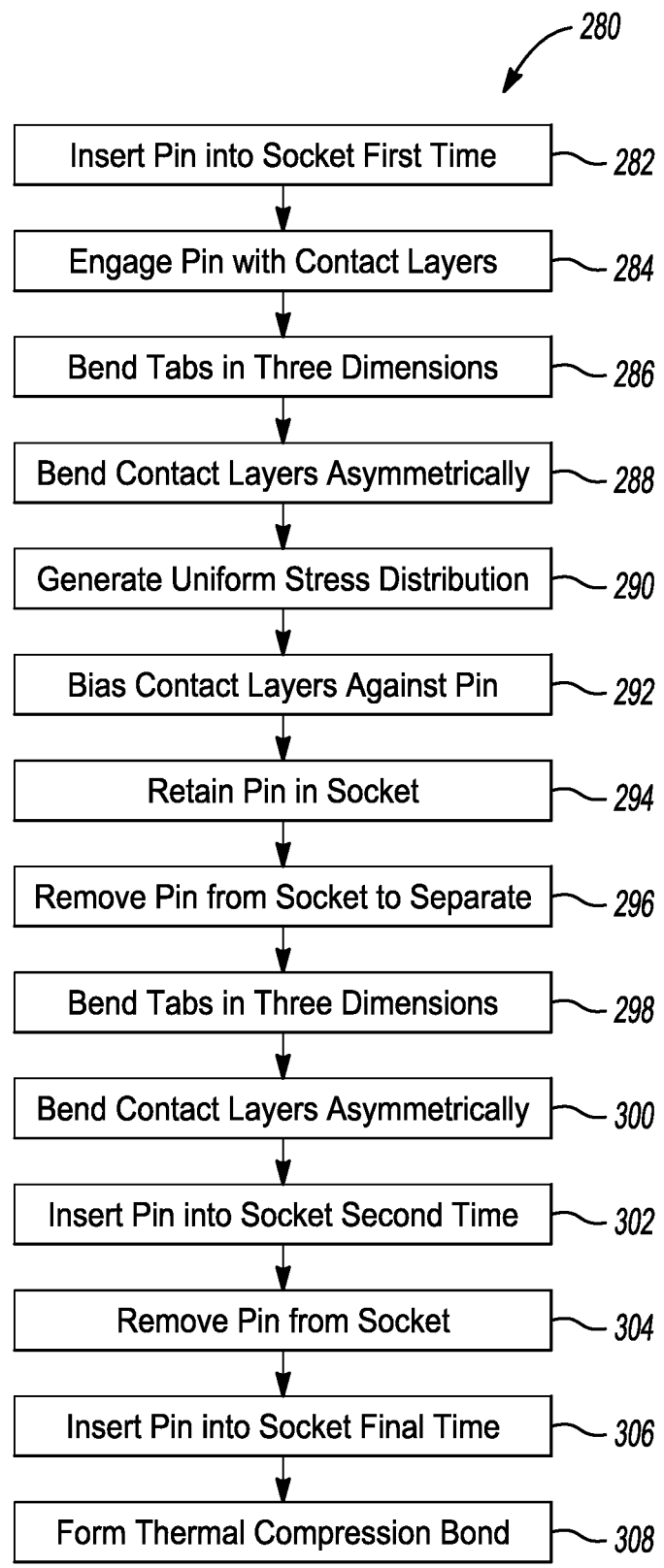
FIG. 12 is a flow diagram of a method for reversible attachment connection in accordance with one or more exemplary embodiments.

Referring to FIG. 12, and referring back to FIGS. 2 and 3, a flow diagram of an example method 280 for reversible attachment connection is shown in accordance with one or more exemplary embodiments. The method 280 (or process) is implemented by the reversible attachment micro connector 200. The method 280 generally includes steps 282 to 308, as illustrated. The sequence of steps is shown as a representative example. Other step orders may be implemented to meet the criteria of a particular application.

In the step 282, a pin 202 (or the first array of pins 230) may be inserted into a socket 204 (or the second array of sockets 232) a first time to establish an electrical connection 205 that mates the first assembly 140 with the second assembly 160. The pin 202 engages the contact layers 212*a*-212*d* coupled to the tabs 210*a*-210*d* of the socket 204 in the step 284. During the insertion of the pin 202, the tabs 210*a*-210*d* and the contact layers 212*a*-212*d* bend in the step 286. The bending of the tabs 210*a*-210*d* and the contact layers 212*a*-212*d* may be asymmetrical in a transverse direction through buckling instabilities in the step 288.

In the step 290, a stress distribution is generated with the negative longitudinal curvature 214 of the tabs 210*a*-210*d* that is uniform between the pin 202 and the tabs 210*a*-210*d* while the pin 202 is seated in the socket 204. The surround structure 206 that forms the tabs 210*a*-210*d* biases the contact layers 212*a*-212*d* against the pin 202 in the step 292 with the spring force 229 provided by the elastomer 206*a* that forms the tabs 210*a*-210*d*. The stress distribution generally retains the pin 202 in the socket 204 in the step 294.

In the step 296, the pin 202 is removed from the socket 204 to separate the first assembly 140 from the second assembly 160. During the removal of the pin 202, the tabs 210*a*-210*d* and the contact layers 212*a*-212*d* bend in the step 298. The bending of the tabs 210*a*-210*d* and the contact layers 212*a*-212*d* is asymmetrical in the transverse direction through buckling instabilities in the step 300.

In the step 302, the pin 202 is inserted back into the socket 204 a second time to reestablish the electrical connection 205 between the pin 202 and the socket 204. The pin 202 may be optionally removed from the socket 204 a second time in the step 304. If removed again, the pin 202 may be repeated inserted into and removed from the socket 204 until a final insertion in the step 306 to establish a mechanical connection between the pin 202 and the pad 226. In the step 308, a thermal compression bond is formed between the pin 202 and the pad 226 to mechanically secure the first assembly 140 to the second assembly 160.

Embodiments of the disclosure generally provide fine-pitch (≤10 µm) reversible attachment micro connectors 200 that allow multiple attachment cycles for multi-dimensional array assemblies and stacked microelectronic assemblies. The reversible attachment micro connectors 200 are low insertion force connectors. The sockets 204 of the reversible attachment micro connectors 200 provide uniform stress distributions between socket sidewalls and the tapered pins 202*a* or the straight pins 202*b* during insertion and seating. The sidewalls generally reduce or eliminate high-stress concentrations during connector assembly that lead to unwanted friction bonding or pin expulsion. The reversible attachment micro connectors 200 is tilt tolerant and generates similar contact pressures between the socket 204 and the pins 202 independent of insertion depth. The reversible attachment micro connectors 200 are self-aligning to provide sub-micron alignment accuracy of mated chip pairs through mechanical wedging.

The reversible attachment micro connectors 200 include a socket 204 with sidewalls that have a negative curvature (e.g., curves away from a center of the socket 204). The negative curvature allows three-dimensional configurations (bending) to be developed during the insertion/removal of a pin 202 that gives rise to internal strain configurations that lead to sidewall buckling. Uniform stress distribution is provided while mating the sockets 204 with a tapered pin 202*a* or a straight pin 202*b*. Multiple connections and multiple disconnections are possible with the reversible attachment micro connectors 200. Fine pitch multi-dimensional assemblies may be assembled, tested, disassemble, reassembled, and finally bonded together using the reversible attachment micro connectors 200.

Clause 1. A reversible attachment micro connector comprising: a pin mounted on a first assembly; and a socket mounted on a second assembly, wherein: the socket is operational to mate with the pin at least two times to establish an electrical connection; the socket is operational to separate from the pin at least once; the socket includes a surround structure that defines a cavity with a floor; the cavity is sized to receive the pin; a plurality of tabs are disposed in the cavity and coupled to the surround structure; the plurality of tabs have a negative longitudinal curvature that protrudes into the cavity; the plurality of tabs bend in three dimensions during insertion of the pin 202 and removal of the pin; the negative longitudinal curvature generates a stress distribution that is uniform between the pin and the plurality of tabs while the pin is seated in the socket; and the pin is retained in the socket based on the stress distribution.

Clause 2. The reversible attachment micro connector according to clause 1, further comprising: a plurality of contact layers coupled to the plurality of tabs, made of metal, and operational to engage the pin.

Clause 3. The reversible attachment micro connector according to clause 2, wherein: the plurality of contact layers bend asymmetrically in a transverse direction through buckling instabilities during the insertion and the removal of the pin.

Clause 4. The reversible attachment micro connector according to clause 2 or clause 3, wherein: the stress distribution is within an elastic regime of the metal that forms the plurality of contact layers.

Clause 5. The reversible attachment micro connector according to clause 2 or clause 3, wherein: the plurality of contact layers is discontinuous around the cavity.

Clause 6. The reversible attachment micro connector according to clause 2 or clause 3, wherein: the plurality of contact layers is perpendicular to the floor of the cavity.

Clause 7. The reversible attachment micro connector according to clause 2 or clause 3, wherein: the surround structure and the plurality of tabs are formed of an elastomer.

Clause 8. The reversible attachment micro connector according to clause 7, wherein:

the elastomer provides a spring force that biases the plurality of contact layers against the pin.

Clause 9. The reversible attachment micro connector according to clauses 1 to 3, further comprising: a pad mounted on the floor of the socket, and operational to form a thermal compression bond with the pin.

Clause 10. The reversible attachment micro connector according to clauses 1 to 3, wherein: the pin has a tapered wall operational to engage the plurality of tabs.

Clause 11. The reversible attachment micro connector according to clauses 1 to 3, wherein: the pin has a cylindrical wall operational to engage the plurality of tabs.

Clause 12. The reversible attachment micro connector according to clauses 1 to 3, wherein: the first assembly includes a first array of pins; and the second assembly includes a second array of sockets.

Clause 13. A method for reversible attachment connection comprising: inserting a pin into a socket a first time to establish an electrical connection that mates a first assembly with a second assembly, wherein: the pin is mounted on the first assembly; the socket is mounted on the second assembly; the socket includes a surround structure that defines a cavity with a floor; a plurality of tabs is disposed in the cavity and coupled to the surround structure; and the plurality of tabs have a negative longitudinal curvature that protrudes into the cavity; bending the plurality of tabs in three dimensions during the inserting of the pin the first time; generating a stress distribution with the negative longitudinal curvature that is uniform between the pin and the plurality of tabs while the pin is seated in the socket; retaining the pin in the socket based on the stress distribution; removing the pin from the socket to separate the first assembly from the second assembly; bending the plurality of tabs in the three dimensions during the removing of the pin; and inserting the pin into the socket a second time to reestablish the electrical connection.

Clause 14. The method according to clause 13, further comprising: engaging the pin with a plurality of contact layers coupled to the plurality of tabs, wherein the plurality of contact layers are made of metal.

Clause 15. The method according to clause 14, further comprising: bending the plurality of contact layers asymmetrically in a transverse direction through buckling instabilities during the inserting of the pin the first time and the removing of the pin.

Clause 16. The method according to clause 13 to 15, further comprising:

biasing a plurality of contact layers against the pin with a spring force provided by an elastomer that forms the plurality of tabs, wherein the plurality of contact layers are coupled to the plurality of tabs, made of metal, and operational to engage the pin.

Clause 17. The method according to clause 13 to 15, further comprising: forming a thermal compression bond between a pad mounted on the floor of the socket and the pin.

Clause 18. A reversible attachment micro connector array comprising: a first array of pins mounted on a first assembly; and a second array of sockets mounted on a second assembly, wherein the second array of sockets is operational to mate with the first array of pins at least two times to establish an electrical connection; the second array of sockets is operational to separate from the first array of pins at least once; individual sockets in the second array of sockets include a surround structure that defines a cavity with a floor; the cavity is sized to receive an individual pin of the first array of pins; a plurality of tabs are disposed in the cavity and coupled to the surround structure; the plurality of tabs have a negative longitudinal curvature that protrudes into the cavity; the plurality of tabs bend in three dimensions during insertion of the individual pin and removal of the individual pin; the negative longitudinal curvature generates a stress distribution that is uniform between the individual pin and the plurality of tabs while the individual pin is seated in the socket; and the individual pin is retained in the individual socket based on the stress distribution.

Clause 19. The reversible attachment micro connector array according to clause 18, wherein: a pitch of the second array of sockets is at most approximately 10 micrometers.

Clause 20. The reversible attachment micro connector array according to clause 18 or clause 19, wherein: a misalignment between the first assembly and the second assembly while mated is at most approximately 0.1 micrometers.

This disclosure is susceptible of embodiments in many different forms. Representative embodiments of the disclosure are shown in the drawings and are herein described in detail with the understanding that these embodiments are provided as an exemplification of the disclosed principles, not limitations of the broad aspects of the disclosure. To that extent, elements and limitations that are described, for example, in the Abstract, Background, Summary, and Detailed Description sections, but not explicitly set forth in the claims, should not be incorporated into the claims, singly or collectively, by implication, inference or otherwise.

For purposes of the present detailed description, unless specifically disclaimed, the singular includes the plural and vice versa. The words "and" and "or" shall be both conjunctive and disjunctive. The words "any" and "all" shall both mean "any and all", and the words "including," "containing," "comprising," "having," and the like shall each mean "including without limitation." Moreover, words of approximation such as "about," "almost," "substantially," "approximately," and "generally," may be used herein in the sense of "at, near, or nearly at," or "within 0-5% of," or "within acceptable manufacturing tolerances," or other logical combinations thereof. Referring to the drawings, wherein like reference numbers refer to like components.

The detailed description and the drawings or FIGS. are supportive and descriptive of the disclosure, but the scope of the disclosure is defined solely by the claims. While some of the best modes and other embodiments for carrying out the claimed disclosure have been described in detail, various alternative designs and embodiments exist for practicing the disclosure defined in the appended claims. Furthermore, the embodiments shown in the drawings or the characteristics of various embodiments mentioned in the present description are not necessarily to be understood as embodiments independent of each other. Rather, it is possible that each of the characteristics described in one of the examples of an embodiment may be combined with one or a plurality of other desired characteristics from other embodiments, resulting in other embodiments not described in words or by reference to the drawings. Accordingly, such other embodiments fall within the framework of the scope of the appended claims.

What is claimed is:

1. A reversible attachment micro connector comprising:
a pin mounted on a first assembly; and
a socket mounted on a second assembly, wherein:
the socket is operational to mate with the pin at least two times to establish an electrical connection;
the socket is operational to separate from the pin at least once;
the socket includes a surround structure that defines a cavity with a floor;
the cavity is sized to receive the pin;
a plurality of tabs are disposed in the cavity and coupled to the surround structure;
the plurality of tabs have a negative longitudinal curvature that protrudes into the cavity;
the plurality of tabs bend in three dimensions during insertion of the pin and removal of the pin;
the negative longitudinal curvature generates a stress distribution that is uniform between the pin and the plurality of tabs while the pin is seated in the socket; and
the pin is retained in the socket based on the stress distribution.

2. The reversible attachment micro connector according to claim 1, further comprising:
a plurality of contact layers coupled to the plurality of tabs, made of metal, and operational to engage the pin.

3. The reversible attachment micro connector according to claim 2, wherein:
the plurality of contact layers bend asymmetrically in a transverse direction through buckling instabilities during the insertion and the removal of the pin.

4. The reversible attachment micro connector according to claim 2, wherein:
the stress distribution is within an elastic regime of the metal that forms the plurality of contact layers.

5. The reversible attachment micro connector according to claim 2, wherein:
the plurality of contact layers is discontinuous around the cavity.

6. The reversible attachment micro connector according to claim 2, wherein:
the plurality of contact layers is perpendicular to the floor of the cavity.

7. The reversible attachment micro connector according to claim 2, wherein:
the surround structure and the plurality of tabs are formed of an elastomer.

8. The reversible attachment micro connector according to claim 7, wherein:
the elastomer provides a spring force that biases the plurality of contact layers against the pin.

9. The reversible attachment micro connector according to claim 1, further comprising:
a pad mounted on the floor of the socket, and operational to form a thermal compression bond with the pin.

10. The reversible attachment micro connector according to claim 1, wherein:
the pin has a tapered wall operational to engage the plurality of tabs.

11. The reversible attachment micro connector according to claim 1, wherein:
the pin has a cylindrical wall operational to engage the plurality of tabs.

12. The reversible attachment micro connector according to claim 1, wherein:
the first assembly includes a first array of pins; and
the second assembly includes a second array of sockets.

13. A method for reversible attachment connection comprising:
inserting a pin into a socket a first time to establish an electrical connection that mates a first assembly with a second assembly, wherein:
the pin is mounted on the first assembly;
the socket is mounted on the second assembly;
the socket includes a surround structure that defines a cavity with a floor;
a plurality of tabs is disposed in the cavity and coupled to the surround structure; and
the plurality of tabs have a negative longitudinal curvature that protrudes into the cavity;
bending the plurality of tabs in three dimensions during the inserting of the pin the first time;
generating a stress distribution with the negative longitudinal curvature that is uniform between the pin and the plurality of tabs while the pin is seated in the socket;
retaining the pin in the socket based on the stress distribution;
removing the pin from the socket to separate the first assembly from the second assembly;
bending the plurality of tabs in the three dimensions during the removing of the pin; and
inserting the pin into the socket a second time to reestablish the electrical connection.

14. The method according to claim 13, further comprising:
engaging the pin with a plurality of contact layers coupled to the plurality of tabs, wherein the plurality of contact layers are made of metal.

15. The method according to claim 14, further comprising:
bending the plurality of contact layers asymmetrically in a transverse direction through buckling instabilities during the inserting of the pin the first time and the removing of the pin.

16. The method according to claim 13, further comprising:
biasing a plurality of contact layers against the pin with a spring force provided by an elastomer that forms the plurality of tabs, wherein the plurality of contact layers are coupled to the plurality of tabs, made of metal, and operational to engage the pin.

17. The method according to claim 13, further comprising:
forming a thermal compression bond between a pad mounted on the floor of the socket and the pin.

18. A reversible attachment micro connector array comprising:
a first array of pins mounted on a first assembly; and
a second array of sockets mounted on a second assembly, wherein
the second array of sockets is operational to mate with the first array of pins at least two times to establish an electrical connection;
the second array of sockets is operational to separate from the first array of pins at least once;

individual sockets in the second array of sockets include a surround structure that defines a cavity with a floor;

the cavity is sized to receive an individual pin of the first array of pins;

a plurality of tabs are disposed in the cavity and coupled to the surround structure;

the plurality of tabs have a negative longitudinal curvature that protrudes into the cavity;

the plurality of tabs bend in three dimensions during insertion of the individual pin and removal of the individual pin;

the negative longitudinal curvature generates a stress distribution that is uniform between the individual pin and the plurality of tabs while the individual pin is seated in the socket; and the individual pin is retained in the individual socket based on the stress distribution.

19. The reversible attachment micro connector array according to claim 18, wherein:

a pitch of the second array of sockets is at most approximately 10 micrometers.

20. The reversible attachment micro connector array according to claim 18, wherein:

a misalignment between the first assembly and the second assembly while mated is at most approximately 0.1 micrometers.

* * * * *